United States Patent
Arzberger et al.

(10) Patent No.: US 12,253,571 B2
(45) Date of Patent: Mar. 18, 2025

(54) METHOD, APPARATUS, AND COMPUTER PROGRAM PRODUCT FOR DETERMINING A RESIDUAL VALUE OF BATTERY STORAGE DEVICES

(71) Applicant: Siemens Aktiengesellschaft, Munich (DE)

(72) Inventors: Arno Arzberger, Bayern (DE); Manfred Baldauf, Erlangen (DE); Sascha Schulte, Höchstadt (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 17/866,733

(22) Filed: Jul. 18, 2022

(65) Prior Publication Data

US 2023/0031420 A1    Feb. 2, 2023

(30) Foreign Application Priority Data

Jul. 23, 2021    (EP) .................................. 21187495

(51) Int. Cl.
*G01R 31/392*    (2019.01)
*G01R 31/36*    (2020.01)
(Continued)

(52) U.S. Cl.
CPC ....... *G01R 31/392* (2019.01); *G01R 31/3647* (2019.01); *G01R 31/385* (2019.01); *G01R 31/389* (2019.01); *G01R 31/396* (2019.01)

(58) Field of Classification Search
CPC .. G01R 31/392; G01R 31/385; G01R 31/389; G01R 31/396; G01R 31/3647
(Continued)

(56) References Cited

U.S. PATENT DOCUMENTS 6,307,377 B1    10/2001    Cummings et al. .......... 324/427
6,526,361 B1 *   2/2003    Jones ................... G01R 31/386
                                                            702/182
(Continued)

FOREIGN PATENT DOCUMENTS

DE            10328721 A1    1/2005    ............. G01R 31/36
DE        102014220914 A1    4/2016    ............. G01R 27/02
(Continued)

OTHER PUBLICATIONS

Zheng, Yuejiu et al: "Study on the correlation between state of charge and coulombic efficiency for commercial lithium ion batteries", Journal of Power Sources, Elsevier, Amsterdam, NL, vol. 289, pp. 81-90, XP029242205, May 18, 2015.
(Continued)

*Primary Examiner* — Huy Q Phan
*Assistant Examiner* — Trung Q Nguyen
(74) *Attorney, Agent, or Firm* — Slayden Grubert Beard PLLC

(57) ABSTRACT

Various embodiments include a method for ascertaining the residual value of a used battery. The method may include: feeding the battery to a test station; bringing it to a test temperature; stabilizing the temperature within less than 2 K; measuring a load cycles using a high-precision coulometry apparatus; carrying out measurement until fulfilment of a termination criterion; ascertaining a first and a second value for a discharging capacity using two different calculation rules, wherein calibration is handled differently in the two calculation rules; carrying out an optimization process; determining a residual value of the battery; and determining whether the used battery is to be employed for use in a static energy storage device.

14 Claims, 3 Drawing Sheets

(51) Int. Cl.
  *G01R 31/385* (2019.01)
  *G01R 31/389* (2019.01)
  *G01R 31/396* (2019.01)

(58) Field of Classification Search
  USPC ........ 324/76.11, 425–435, 415, 126, 756.05, 324/200, 207.13, 2, 33, 256, 500–750.6
  See application file for complete search history.

(56) References Cited

U.S. PATENT DOCUMENTS

| | | | |
|---|---|---|---|
| 7,928,735 B2* | 4/2011 | Huang .................... | B60L 58/15 |
| | | | 324/426 |
| 8,912,761 B2 | 12/2014 | Izumi ........................... | 320/148 |
| 11,422,199 B1 | 8/2022 | Xu et al. | |
| 11,486,932 B2 | 11/2022 | Delaille | |
| 2006/0250137 A1 | 11/2006 | Frey et al. ..................... | 324/426 |
| 2008/0265840 A1* | 10/2008 | De Paula ............ | G01R 31/367 |
| | | | 320/132 |
| 2012/0215472 A1 | 8/2012 | Tezuka et al. .................. | 702/63 |
| 2012/0310565 A1 | 12/2012 | Redey ............................. | 702/63 |
| 2013/0234672 A1 | 9/2013 | Kubota et al. ................. | 320/134 |
| 2013/0325279 A1 | 12/2013 | Fujimoto et al. ............... | 701/74 |
| 2014/0095090 A1 | 4/2014 | Chen et al. ..................... | 702/63 |
| 2014/0257725 A1* | 9/2014 | Creff ....................... | B60L 58/12 |
| | | | 702/63 |
| 2015/0160302 A1* | 6/2015 | Xu ........................ | H01M 10/42 |
| | | | 324/427 |
| 2015/0301118 A1 | 10/2015 | Tao et al. | |
| 2016/0109526 A1 | 4/2016 | Geffin et al. .................. | 702/189 |
| 2016/0109528 A1 | 4/2016 | Schleicher et al. ........... | 324/430 |
| 2017/0153292 A1* | 6/2017 | Steiber ............... | G01R 31/3648 |
| 2018/0017628 A1 | 1/2018 | Takegami et al. | |
| 2020/0278399 A1 | 9/2020 | Zhang et al. | |
| 2020/0284846 A1 | 9/2020 | Pajovic et al. | |
| 2020/0341064 A1* | 10/2020 | Miftahullatif ....... | H01M 10/486 |
| 2021/0116513 A1 | 4/2021 | Du et al. | |
| 2022/0120815 A1* | 4/2022 | Wei ....................... | G01R 31/388 |
| 2022/0214399 A1* | 7/2022 | Liaw ..................... | G01R 31/387 |
| 2023/0028368 A1 | 1/2023 | Arzberger | |
| 2023/0031420 A1 | 2/2023 | Arzberger et al. | |
| 2023/0194624 A1* | 6/2023 | Hinterbrandner .... | G01R 31/392 |
| | | | 324/434 |

FOREIGN PATENT DOCUMENTS

| | | | | |
|---|---|---|---|---|
| EP | 4063882 | A1 | 9/2022 | ........... G01R 31/367 |
| JP | 6494840 | | 4/2001 | ............ H01M 10/54 |
| JP | 2011222343 | A | 11/2011 | ............ H01M 10/48 |
| JP | 2012122787 | A | 6/2012 | ............ G01R 31/36 |
| JP | 2013249026 | A | 12/2013 | ............ B60K 35/00 |
| JP | 2017067788 | A | 4/2017 | ............ G01R 31/36 |
| JP | 2017083474 | A | 5/2017 | ............ G01R 31/36 |
| JP | 2017099221 | A | 6/2017 | ............ G01R 31/36 |
| JP | 2022182460 | A | 12/2022 | ........ G01R 31/3828 |
| JP | 2023016707 | A | 2/2023 | .......... G01R 31/382 |
| JP | 7423697 | B2 | 1/2024 | .......... G01R 31/367 |
| WO | 83/02005 | A1 | 6/1983 | ............ G01R 31/36 |
| WO | 2019/142550 | A1 | 7/2019 | ............ G01R 31/36 |
| WO | 2021/089786 | A1 | 5/2021 | ........... G01R 31/367 |

OTHER PUBLICATIONS

Zhang, Shuzhi et al: "A rapid online calculation method for state of health of lithium-ion battery based on coulomb counting method and differential voltage analysis"; Journal of Power Sources, Elsevier, Amsterdam, NL; vol. 479, XP086345101, Aug. 31, 2020.
Extended European Search Report, Application No. 21187494.6, 6 pages, Jan. 21, 2022.
Extended European Search Report, Application No. 21187495.3, 7 pages, Jan. 21, 2022.
Japanese Office Action, Application No. 2022101470, 8 pages, Oct. 3, 2023.
Japanese Office Action, Application No. 2022101471, 9 pages, Oct. 3, 2023.
U.S. Notice of Allowance, U.S. Appl. No. 17/866,652, 18 pages, Nov. 3, 2023.
Japanese Notice of Allowance, Application No. 2022101471, 7 pages, Dec. 19, 2023.
Smith, A.J. et al., "Precision Measurements of the Coulombic Efficiency of Lithium-Ion Batteries and of Electrode Materials for Lithium-Ion Batteries," Journal of the Electrochemical Society, vol. 157, No. 2, 7 pages, Dec. 17, 2009.
Smith, A.J. et al., "Interpreting High Precision Coulometry Results on Li-ion Cells," Journal of the Electrochemical Society, vol. 158, No. 10, 7 pages, Aug. 15, 2011.
Fleischauer, M.D. et al., "Calibration Process for Rechargeable Cell and Battery Test Systems," Review of Scientific Instruments, vol. 90, 8 pages, Apr. 9, 2019.
Japanese Office Action, Application No. 2022094914, 10 pages, Feb. 6, 2024.
U.S. Non-Final Office Action, U.S. Appl. No. 17/866,686, 44 pages, Oct. 22, 2024.

* cited by examiner

METHOD, APPARATUS, AND COMPUTER PROGRAM PRODUCT FOR DETERMINING A RESIDUAL VALUE OF BATTERY STORAGE DEVICES

CROSS-REFERENCE TO RELATED APPLICATIONS

This application claims priority to EP Application No. 21187495.3 filed Jul. 23, 2021, the contents of which are hereby incorporated by reference in their entirety.

TECHNICAL FIELD

The present disclosure relates to batteries. Various embodiments of the teachings herein include methods, apparatuses, and/or computer products which may be used for determining a residual value of a battery storage device.

BACKGROUND

Lithium-ion accumulators are used, due to their high power and energy densities, as energy storage devices in many mobile and static applications. What is new therein is the rapidly increasing use in electrically powered vehicles and as static intermediate storage for the electrical supply in buildings. In the following, the accumulators are referred to in these technical fields of use, in everyday language, as batteries or battery storage devices.

From approximately 2025, the first traction batteries for use in vehicles will have been used up in relatively large numbers of more than 10,000 because their residual capacity after approximately 5 to 8 years of operation in vehicles will have become too low or the vehicle is scrapped for other reasons. In an ideal case, these batteries could still be used for many more years as static stores for supply grid purposes. Batteries of this type that should no longer be used in a vehicle, not by reason of their own age but for other reasons, can also be considered for this purpose.

However, this use which is designated a "second life" is in competition with raw material recycling, which defines a minimum quality and a remaining useful life and thus a minimum for the residual value of the used-up batteries, below which a deployment in a second life is no longer economical. The battery management systems of used batteries typically provide information in this regard. However, this is so inexact that business models for static storage devices made from second life batteries or used batteries as replacement parts are not viable.

In order to ascertain the suitability of used batteries for a possible second life deployment, a measurement of the residual capacity can take place through one or a few full cycles and the measurement of the internal resistance can be carried out at a state of charge point. Under some circumstances, the residual capacity can also be ascertained by reading out the battery management system if a reliable sufficiently accurate state of health (SOH) value is stored there. On the basis of this status information, the used batteries can be subdivided into the most homogeneous possible groups which are characterized by the narrowest possible distribution curve of their properties. Batteries from a group are then used in a storage device or a battery rack and connected together. This ensures that the individual batteries of a rack or storage device currently exhibit similar behavior and thus are all loaded equally. The latter point prevents individual batteries being overloaded in relation to their current state by use in the energy storage device and therefore aging more rapidly than other cells or modules in the same rack or storage device.

However, it is disadvantageous in the aforementioned conventional approach that the aforementioned variables of residual capacity and internal resistance reflect only the present state, but not the trend over time. This means that the temporal development of the state of health of the battery that is to be expected in the next operating phases is not known. It can therefore be the case, for example, that two batteries each have a residual capacity of 80%. Therein, one has been operated carefully in its previous use and is still in a state in which the capacity loss continues slowly and with an almost linear progression. The other battery, by contrast, due to a harsh operating mode, may already be subject to a rapid loss of capacity during future charge-discharge cycles, so that on further operation in a static energy storage device, a steep progression of the aging curve is to be expected. This is referred to as the so-called knee point which marks the transition from the slow, often linear, progression of the aging curve to a significantly steeper, and often convexly (that is, accelerating) curved progression. During further operation, the two batteries would rapidly grow apart in their properties so that after a short operating period, an inhomogeneously assembled storage device system would develop.

SUMMARY

The teachings of the present disclosure include methods and apparatuses with which an improved residual value determination on used batteries is enabled. For example, some embodiments include a method for ascertaining the residual value of a used battery (2), in which the battery (2) is fed to a test station (1), the battery (2) in the test station (1) is brought to a test temperature and the test temperature is stabilized for the duration of the test such that the deviations from the test temperature that arise are less than 2 K, a plurality of load cycles (100) of the battery (2) are measured by means of a high-precision coulometry apparatus (4), wherein the result of the measurement comprises a plurality of current values, the measurement is carried out until the fulfilment of a termination criterion, on the basis of the result of the measurement, a first and a second value for a discharging capacity of the battery (2) is ascertained by way of a first and a second calculation rule, wherein a calibration of the current measurement is included differently in the first and the second calculation rule and an optimization process is carried out in which a calibration of the current measurement is ascertained with which the largest matching of the ascertained first and second discharging capacity is achieved, on the basis of the results of the measurement, at least one residual value criterion of the battery (2) is determined, and on the basis of the residual value criterion, it is determined whether the used battery (2) is to be employed for use in a static energy storage device.

In some embodiments, the test temperature is stabilized for the duration of the test such that the deviations from the test temperature that arise are less than 0.5 K, in particular less than 0.05 K.

In some embodiments, the test temperature is stabilized for the duration of the test by using a cooling system of the battery (2).

In some embodiments, the capacity of the battery (2) and/or data stored in the battery management system of the battery (2) is used as additional residual value criteria.

In some embodiments, as a residual value criterion, a coulomb efficiency, an energy efficiency, an effective cell internal resistance and/or a capacity loss per cycle of the battery (2) is determined.

In some embodiments, the residual value criteria are stored in a database with an identifier for the battery (2).

In some embodiments, real aging data of batteries (2) tested with this method is captured in use in a static battery storage device and while using the real aging data and the stored residual value criteria, it is determined whether the battery will be used for operation in a static energy storage device.

In some embodiments, the load cycles (100) comprise a discharging of less than 40%, in particular less than 25% and function with a C-coefficient of between 0.5 and 1.5, in particular between 0.8 and 1.2.

In some embodiments, from the residual value criteria, a category of static energy storage devices is ascertained for which the battery (2) is best suited.

In some embodiments, a load cycle (100) comprises a first discharging in which a first charge quantity is measured from a first charging state (21) to a second charging state (22), a subsequent first charging in which a second charge quantity is measured from the second charging state (22) to a third charging state (23) and a second discharging in which a third charge quantity is measured from the third charging state (23) to a fourth charging state (24), wherein the charging and discharging of the load cycle (100) takes place between a lower voltage and an upper voltage of the battery (2).

In some embodiments, a first charge displacement is determined by means of a difference between the fourth charging state (24) and the second charging state (22) and a second charge displacement is determined by means of a difference between the third charging state (23) and the first charging state (21), a capacity loss is ascertained from the difference between the first charge displacement and the second charge displacement, and a mean capacity loss is ascertained on the basis of at least two capacity losses of different load cycles (100).

In some embodiments, as the termination criterion, the relative change of the capacity loss in two or more successive load cycles (100) is used.

In some embodiments, the termination criterion is selected as a function of the classification arising according to the existing measurement result.

As another example, some embodiments include an apparatus (1) for carrying out one or more of the methods described herein, comprising: a high-precision coulometry apparatus (4), and a computing unit (10) with a storage device for receiving results of a measurement series on the battery (2), wherein the computing unit (10) is configured to carry out the optimization process.

As another example, some embodiments include a computer program product (13) which can be directly loaded into a memory store of a programmable computing unit (10), having program code means in order to carry out one or more of the methods described herein when the computer program product (13) is executed in the computing unit (10).

BRIEF DESCRIPTION OF THE DRAWINGS

Further features, properties, and advantages of various embodiments of the teachings of the present disclosure are described in the following description, making reference to the accompanying figures. In the figures, shown schematically.

DETAILED DESCRIPTION

Figure 1:
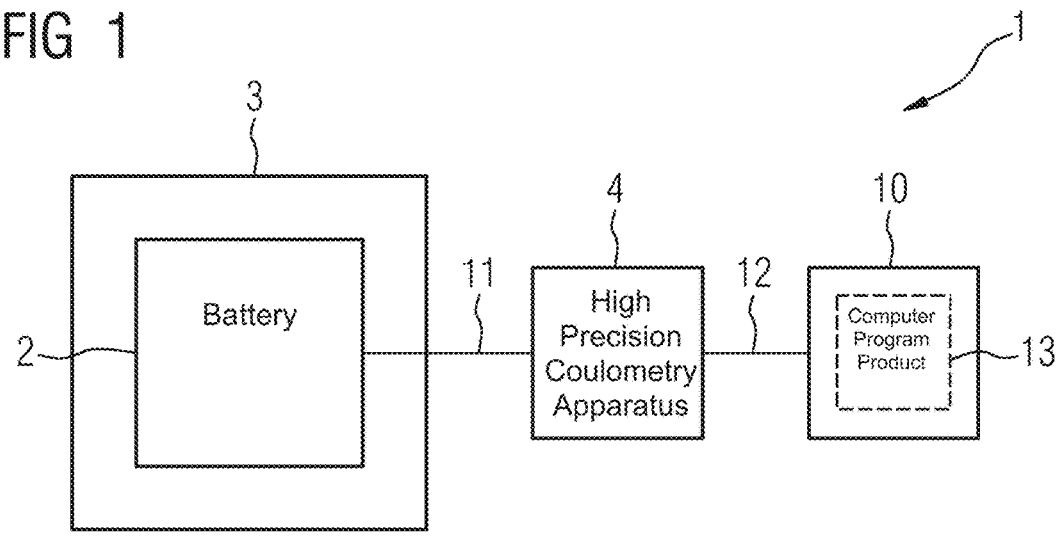
FIG. 1 shows an apparatus for ascertaining a residual value for a used battery incorporating teachings of the present disclosure.

Various embodiments of the teachings herein include methods for ascertaining the residual value of a battery. In these methods, the battery is fed to a test station and is brought to a test temperature in the test station. The test temperature is stabilized for the duration of the test such that the deviations from the test temperature that arise are less than 2 K.

In some embodiments, a plurality of load cycles of the battery are measured using of a high-precision coulometry apparatus, wherein the result of the measurement comprises a plurality of current values. Therein, an operating point is selected for the load cycles that is as informative as possible, but at the same time is also undemanding, in particular with a state of charge of less than 50%.

The measurement is carried out until the fulfilment of a termination criterion and, on the basis of the result of the measurement, a first and a second value for a discharging capacity of the battery is ascertained by way of a first and a second calculation rule, wherein a calibration of the current measurement is included differently in the first and the second calculation rule and an optimization process is carried out in which a calibration of the current measurement is ascertained with which the greatest matching of the ascertained first and second discharging capacity is achieved.

In some embodiments, on the basis of the results of the measurement, at least one residual value criterion of the battery is determined and on the basis of the residual value criterion, it is determined whether the battery is to be used for deployment in a static energy storage device.

An apparatus incorporating teachings of the present disclosure is designed to carry out one or more of the methods described herein and comprises a high-precision coulometry apparatus and a computing unit with a storage device for receiving results of a measurement series on the battery, wherein the computing unit is configured to carry out the optimization process and the determination of whether the battery will be used in a static battery storage device.

The residual value determination is not necessarily to be understood as a determination of a purely monetary residual value, but rather a technical and economical decision of whether a deployment in a static energy storage device is useful. It also at least partially involves a determination of the remaining useful life (RUL).

In some embodiments, the methods or systems may be used to obtain a very precise estimation of the residual value of a battery. With this estimation, static energy storage devices can be created employing used batteries, with a significantly reduced risk of a subsequent servicing expenditure, outage or premature incapacitation of the battery. Therefore, a significantly improved possibility for the use of such lithium-ion batteries is provided, the deployment of which in vehicles is no longer useful or desired. This is also advantageous from environmental standpoints, since the subsequent recycling of the raw materials is thus preceded by a further use.

In some embodiments, not only a current residual capacity, but also an aging rate is ascertained. Since, therefore, the future rate of the capacity loss is provided, a significantly improved assignment of the battery to a group of batteries with similar aging behavior is enabled. It is thus ensured that during operation, the batteries of a static energy storage device retain similar properties for a longer time and do not develop divergently. It can be established whether the knee point is still significantly ahead or has been reached or whether perhaps it has already been passed and the steep portion of the aging curve has been reached.

In some embodiments, subcycles can already be used for characterizing the prevailing degradation rate so that apart from the time gain, no additional aging is caused by full cycles.

In some embodiments, the test temperature can be stabilized for the duration of the test such that the deviations from the test temperature that arise are less than 0.5 K, in particular even less than 0.05 K. A temperature that is exactly established during the HPC measurement provides for particularly informative measurement results. For the success of static energy storage devices with used batteries, it is very important that the behavior of the used batteries employed corresponds for as long and as accurately as possible to the predicted behavior. Since this behavior is ascertained from a momentary measurement, it is important that the measurement is as accurate as possible.

In some embodiments, the test temperature can be stabilized for the duration of the test using the cooling system of the battery. By this means, the construction effort required for the temperature regulation of the battery during the measurement is reduced.

In some embodiments, stored data can also be used as additional residual value criteria. The use of the data stored in the battery management system allows further data is available in order to undertake as accurate a determination of the residual value as possible. Although this further data is not obtained as part of the high-precision coulometry measurement and is therefore of lower accuracy, it offers data that has been obtained during the actual operation of the battery, that is in the conditions of its prior use. These conditions therefore possibly offer an insight into the behavior of the battery at operating points which are not used in the HPC measurement. The data from the battery management system also offers the possibility of a pre-selection. Therein, for example, a battery can no longer be measured if, on the basis of the data from the battery management system, it is predictably not suitable for a second life deployment. In some embodiments, the termination criterion for the measurement can be adapted and thus valuable measuring time can be spared.

In some embodiments, as a residual value criterion, a coulomb efficiency, an energy efficiency, an effective cell internal resistance and/or a capacity loss per cycle of the battery can be determined. The residual value criteria therefore do not all have to be extracted from the HPC measurement, but can also originate from other sources. Such sources are especially readily available, in particular, for used batteries. A further residual value criterion is the capacity. This can be extracted from the battery management system or ascertained in a separate qualification measurement.

In some embodiments, if two or more of the aforementioned variables are used, then the decision regarding the residual value of the battery may be made on the basis of a plurality of independent key performance indicators (KPI) determined in a single measurement. In this way, the robustness of the selection process is increased, the informativeness increases and new possibilities arise for the integration of data feedback from field use of the batteries produced.

From the capacity, an estimate of the currently possible energy throughput can be obtained. From the electrical internal resistance of the battery, an estimate of the cooling power needed can advantageously be obtained.

The more residual value criteria that are ascertained, the better a design of a cost-effective static battery system can be undertaken wherein the batteries grouped in the system are to have the most identical possible electrical, thermal and aging behavior.

In some embodiments, the residual value criteria can be stored in a database together with an identifier for the battery. Storage of this type enables a later evaluation of the data gathered in this way, for example, to recognize differences regarding different prior lives of the used batteries. Furthermore, the storage enables a comparison to be made with aging data which is obtained in later use of the batteries as static energy storage devices. It is therefore particularly advantageous if real aging data of batteries is captured in use in a battery storage device and, while using the real aging data and the stored residual value criteria, it is determined whether the battery currently being examined will be used for deployment in a static energy storage device.

In some embodiments, the load cycles can comprise a charging of less than 40%, in particular less than 25%. Furthermore, the load cycles can function with a C-coefficient of between 0.5 and 1.5, in particular between 0.8 and 1.2. By this means, together with the charging, an operating point for the measurement of the battery is provided wherein the state of charge (SOC) together with the discharging (DOD) is not too high, in order to reduce the power costs arising and, secondly, the discharging is sufficient for an informative measurement. Such an operating point is 30% SOC and 20% DOD and 1 C.

In some embodiments, for at least a part of the load cycles, one or more further operating points that are different from the aforementioned operating point can be used. By this means, the measurement is more informative with regard to different operating situations occurring in the real operation of the battery. For example, a second operating point at 50% SOC, 10% DOD and 0.5 C and in particular a third operating point at 75% SOC, 20% DOD and 0.2 C can be measured.

In some embodiments, from the residual value criteria, a category of static energy storage devices can be ascertained for which the battery is best suited. Thus, for example, on the basis of different operating points, it can be ascertained whether the battery is most suited to use in an energy storage device for operating reserve, peak shaving or as an intermediate store for renewable energy sources. These different deployment forms place different demands on the batteries used, meaning that their aging occurs differently.

In some embodiments, in this way, it is made possible not only to divide the used batteries into more homogeneous groups with regard to their aging properties, but a specific recommendation can also be made for their new deployment situation.

A load cycle comprises a first discharging in which a first charge quantity is measured from a first charging state to a second charging state, a subsequent first charging in which a second charge quantity is measured from the second charging state to a third charging state and a second discharging in which a third charge quantity is measured from the third charging state to a fourth charging state, wherein the charging and discharging of the load cycle takes place between a lower voltage and an upper voltage of the battery storage device.

A first charge displacement can be determined by means of a difference between the fourth charging state and the second charging state and a second charge displacement can be determined by means of a difference between the third charging state and the first charging state. Furthermore, a capacity loss can be ascertained from the difference between the first charge displacement and the second charge displacement and a mean capacity loss can be ascertained on the basis of at least two capacity losses of different load cycles.

The capacity loss thereby ascertained can be used as a termination criterion. In particular, the relative change of the capacity loss can be observed in two or more successive load cycles. If this is sufficiently low, the battery can be regarded as already in a steady-state condition and the measurement can be terminated.

The capacity loss thereby ascertained can be used as a residual value criterion of the battery. Thus, apart from the aforementioned residual value criteria, a further such criterion is available which improves the informativeness of the measurement.

It is possible to select the termination criterion as a function of the classification of the battery according to the already existing measurement result. Thus, for example, a measurement can be terminated if it becomes apparent for a battery that it must be considered a reject, that is, that it cannot be considered for use in a static energy storage device.

The termination criteria used can be combined with one another. Thus, for example, a termination of the measurement can take place if a minimum number of the already measured load cycles is exceeded and the deviation of the capacity losses exceeds a threshold value.

The computer program product can be provided that is able to be loaded directly into a storage device of a programmable computing unit. It comprises program code means in order to carry out one or more of the methods described herein when the computer program product is executed in the computing unit.

FIG. 1 shows an apparatus 1 for ascertaining a residual value for a used battery 2 incorporating teachings of the present disclosure. The apparatus 1 comprises a high-precision coulometry apparatus 4 and a temperature-controlled chamber 3. A used battery 2 is introduced into the temperature-controlled chamber 3 and is connected by means of a power cable 11 to the high-precision coulometry apparatus 4. Furthermore, a cooling system (not shown in FIG. 1) of the battery 2 is connected to the temperature-controlled chamber 3 such that the cooling system can also be used for the stabilization of the temperature of the battery 2. The stabilization takes place such that for the period of the measurements, a very constant temperature is maintained. The temperature can be, for example, 25° C. and the deviations in the timeframe of the measurements are less than 0.1 K in this exemplary embodiment.

The high-precision coulometry apparatus 4 is in turn connected to a computing unit 10 via a data cable 12. The high-precision coulometry apparatus 4 records, with very high accuracy, a charge-time graph of the battery 2. The battery 2 is therein operated with a periodic load cycle 100.

The computing unit 10 comprises a computer program 13 which carries out the processing of the data transferred from the high-precision coulometry apparatus 4. The computer program stores the values at least temporarily.

Figure 2:
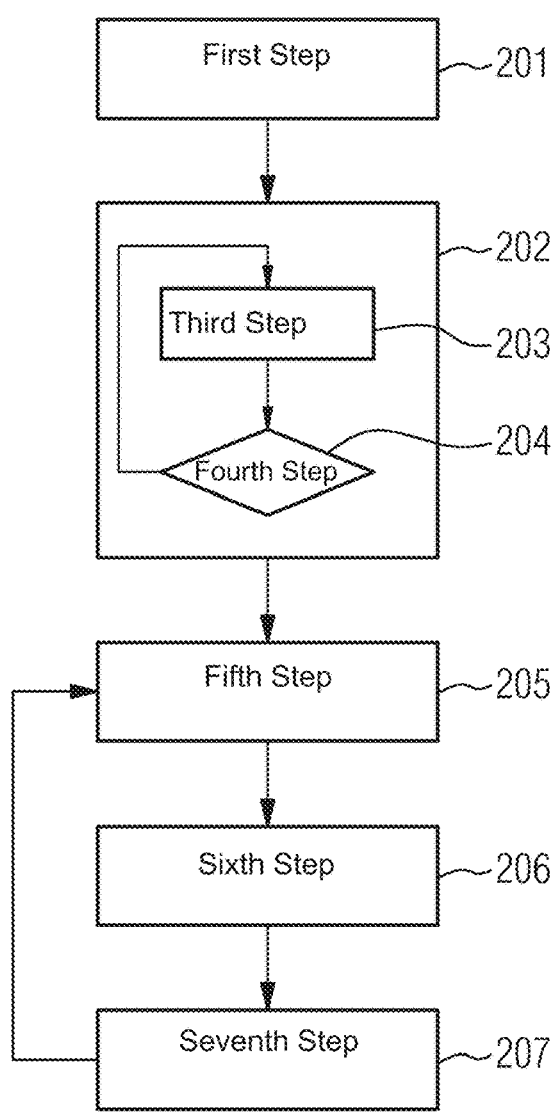
FIG. 2 shows a process diagram for ascertaining a residual value for the battery by means of the apparatus incorporating teachings of the present disclosure.

FIG. 2 shows a process diagram for a method for residual value ascertainment for the battery 2 incorporating teachings of the present disclosure, which is carried out with the apparatus 1 shown in FIG. 1. The computation steps of the method may be carried out by the computer program 13 on the computing unit 10.

In a first step 201, a used battery 2 is introduced into the temperature-controlled chamber 3 and is temperature controlled. Thus, a constant temperature is reached during the subsequently measured load cycles 100. The first step 201 can be omitted in some embodiments contingent upon the manner of the feeding of the battery 2 to the temperature-controlled chamber 3 and, in other embodiments this step 201 can last a few hours.

Following upon the first step 201 is a second step 202 in which a measurement of the battery 2 is undertaken by means of the high-precision coulometry apparatus 4. Therein, the aforementioned load cycles 100 are carried out and at least current measurements are performed, which permits a determination of the charge quantities.

The second step 202 also comprises a third step 203 in which a current calibration is carried out with the data ascertained. Furthermore, the second step 202 also comprises a fourth step 204 in which a decision is made as to whether a termination criterion exists. If this is not the case, the measurement of the battery 2 is continued with a further load cycle 100.

The third and fourth steps 203, 204 can therein be carried out after each load cycle or always after a settable number of further measured load cycles. Therein, the third and fourth steps 203, 204 are, in principle, dependent upon one another, although they can be carried out at common times. In the present example, the third and fourth steps 203, 204 are each carried out after ten load cycles 100.

As the termination criterion, in this exemplary embodiment, a combination of different factors is used. A first factor is a minimum number of load cycles 100, in this case 100. According to experience, a steady state of the behavior of a battery is not reached before this number of load cycles reaches 100. As a further factor, a deviation of the capacity loss between successive load cycles 100 is used. This is described below. If this deviation falls below 5%, a steady-state condition of the battery 2 can be assumed.

Further included in the termination criteria is what result would ensue for the battery 2 if the previous data following the minimum number of load cycles 100 is taken into account. If the result is already such that the battery is no longer suitable for deployment in a static energy storage device, further measurement is terminated. If, however, the battery 2 has a high expected quality in respect of aging, the measurement is continued.

If the termination criterion is met, the measurement of the battery 2 is ended. A determination of final residual value criteria then takes place in a fifth step 205. In this example, in the fifth step 205, a coulomb efficiency and an energy efficiency are determined. These residual value criteria are then evaluated, for example, in that they are compared individually with settable threshold values. This evaluation is, at least partially, a cost-effectiveness assessment in which it is clarified whether the use of the battery 2 in a static energy storage device is expected to be profitable, taking account of its prospective aging properties. In other parts, it is also a safety observation in which it is clarified whether the use of the battery is justifiable, for example, that it entails no fire risk. At this point, a cost-effectiveness consideration can be carried out, as is done in the case of energy storage using new batteries, wherein the measured data takes the place of manufacturer data regarding the battery.

If this evaluation reveals that deployment in a static energy storage device, that is a second life deployment of the battery 2, is not worthwhile, then it is transferred, for example, to a raw material recycling facility. It is possible to discard the data and residual value criteria obtained.

If, however, the evaluation of the residual value criteria reveals that the battery 2 is suitable for use in a static energy storage device, then in a sixth step 206, the residual value criteria obtained are stored. The storage of the values ascertained takes place in a database together with an identifier, for example, a serial number of the battery 2. Furthermore, characteristic values that are extracted from the battery management system of the battery 2 are also stored there. For this purpose, the computing unit 10 is also connected to the battery management system in order to be able to undertake a data exchange. Typically, data such as the estimated residual capacity and information stored in an error memory store can typically be extracted from the battery management system. Data concerning the estimated residual capacity can be enhanced by a separate capacity measurement according to the datasheet of the battery 2 or an alternative test protocol.

Since the residual value criteria determined in the fifth step 205 are stored together with the identifier, in a seventh step 207 a comparison of the prediction values thereby ascertained with actual aging data for the batteries 2 can be carried out. For this purpose, such actual aging data is recorded at the batteries 2 in the course of their second life deployment in the static energy storage device. This data is compared with the stored residual value criteria which correspond to momentary measurement values and with the data extracted from the battery management system which corresponds to data from the previous life. If systematic deviations of the expected residual value are found, that is the operating properties in the static energy storage device which correlate with one or more of the residual value criteria, then a correction of the evaluation undertaken in the fifth step 205 is carried out, for example, a change in the threshold values. These changed threshold values lead to an improved residual value determination for used batteries 2 tested in future.

Figure 3:
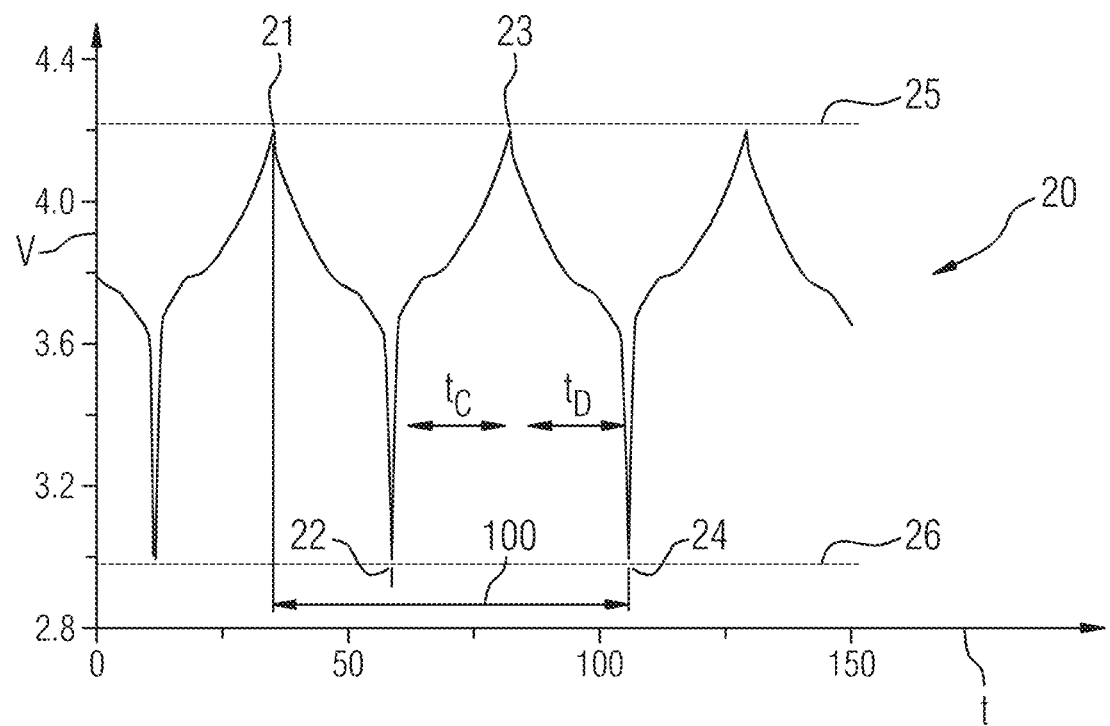
FIG. 3 shows a voltage-time graph of a load cycle incorporating teachings of the present disclosure.

The actual measurement of the batteries 2 takes place by means of the high-precision coulometry apparatus 4. FIG. 3 shows a voltage-time graph which the high-precision coulometry apparatus 4 has recorded during a periodic load cycle 100 of the battery 2. A load cycle 100 comprises a discharging from a first state of charge 21 to a second state of charge 22, wherein the first state of charge 21 is at an upper voltage 25 and the second state of charge 22 is at a lower voltage 26. Subsequently, in the load cycle 100, the battery storage device 2 is charged from the second state of charge 22 to a third state of charge 23. As a next step in the load cycle 100, discharging takes place from the third state of charge 23 to a fourth state of charge 24. In each individual charging/discharging step, an upper voltage 25 and a lower voltage 26 are adhered to as voltage limits. The charging lasts for the charging period $t_C$. The discharging lasts for the discharging period $t_D$.

Figure 4:
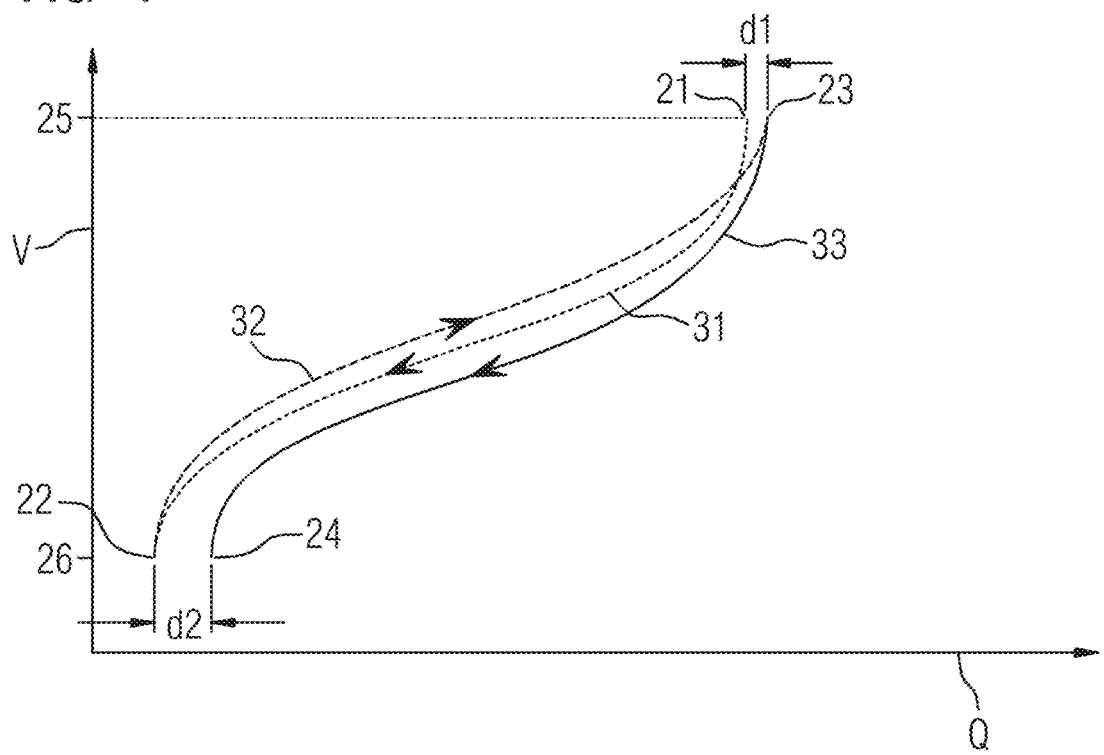
FIG. 4 shows a voltage-charge graph of a load cycle incorporating teachings of the present disclosure.

On the basis of the measurement shown in FIG. 3, as shown in FIG. 4, it can now be ascertained what cumulative charge quantity has flowed in the individual charging and discharging steps. FIG. 4 shows a graph in which the voltage of the battery storage device is plotted over the cumulative charge quantity Q. The load cycle 100 begins again at the first state of charge 21. The battery storage device 2 is discharged as far as the second state of charge during the first discharging 31. Therein, a first charge quantity Q1 is extracted from the battery storage device 2. The first charge quantity Q1 can be calculated with equation 1, where I is the current flow and $t_D$ is the discharging period:

$$Q1 = \int^{t_D} I(t) dt \qquad \text{Equation 1}$$

Subsequently within the load cycle 100, the battery storage device 2 is charged from the second state of charge 22 to the third state of charge 23 by means of a first charging 32. A second charge quantity Q2 is loaded into the battery storage device 2. Q2 can be calculated by means of equation 2:

$$Q2 = \int^{t_C} I(t) dt \qquad \text{Equation 2}$$

Subsequently within the load cycle 100, the battery storage device 2 is discharged from the third state of charge 23 to the fourth state of charge 24 by means of a second discharging 33. The charge quantity Q3 removed can in turn be calculated similarly to equation 1 from the time period of the discharging and the associated current flow.

It is now possible, between the first state of charge 21 and the third state of charge 23, to determine a first charge displacement d1. Furthermore, a second charge displacement d2 between the second state of charge 22 and the fourth state of charge 24 can be ascertained. From the difference between the first charge displacement d1 and the second charge displacement d2, a capacity loss dKap can now be ascertained for the load cycle 100 by means of equation 3.

$$dKap = d2 - d1 \qquad \text{Equation 3}$$

Figure 5:
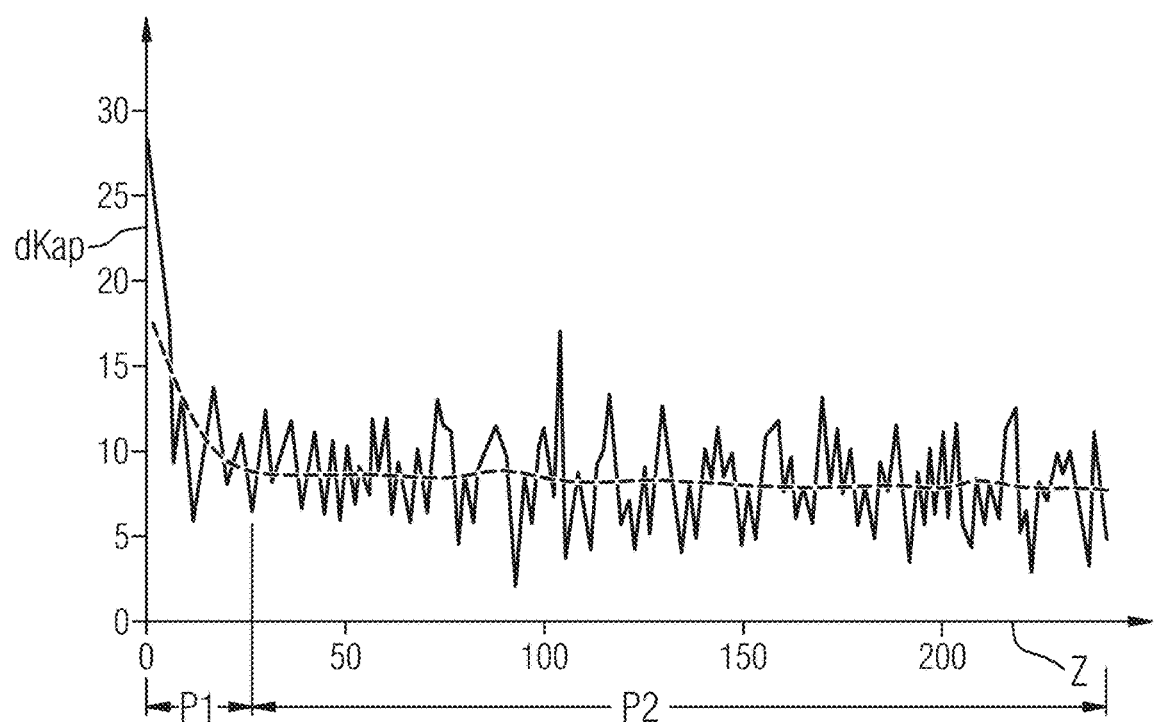
FIG. 5 shows a graph of the capacity loss over the progression of the load cycles incorporating teachings of the present disclosure.

FIG. 5 shows the capacity loss per load cycle for 250 load cycles. Therein, the load cycle number Z is shown on the x-axis, that is, the incremental number of the respective load cycle 100 and the capacity loss dKap per load cycle 100 is shown on the y-axis. FIG. 5 makes clear that initially a settling phase P1 occurs during the successive load cycles 100. The length of the settling phase P1 is dependent upon the operating point and the prior history of the battery 2.

The determination of the mean capacity loss $dKap_{mean}$ as the measurement value of the method takes place by way of a sliding linear fit over the values of the capacity loss dKap and the determination of the smallest gradients in the straight line equations thus generated. Starting from a fit across all the values of the capacity loss dKap, that is, the value 1 to the value 250, the dataset is continuously shortened and generates a new (fitted) straight line (2 to 250, 3 to 250, etc.). The fit is carried out as far as a particular minimum residual length of the dataset, for example 10% of the total length. Thereafter, the straight line equations are sorted, in particular, ascending by size according to the values of their gradients. The measurement can then be considered valid if at least two of the gradients have a quantitative value of less than 10% of the mean value of the last 10% of the capacity losses dKap. If, for example, the mean value of the last twenty capacity losses, in particular where at least 200 capacity losses are measured, is 5 mAh/load cycle, then the gradient of the two best tangents (fits) should amount to less than 0.5 mAh/load cycle.

Rather, the measurement is to be repeated, in particular with a greater number of support points since no sufficiently static state of the system has been reached. From the sorting, a particular number is ascertained, for example rounded down 3% of the total length of the dataset and/or a minimum number of two measurement values is selected and the corresponding start index of the fitted straight lines is ascertained. For each of the portions thus ascertained, an averaged capacity loss is given as an arithmetic mean value over the included capacity losses dKap. The value of the mean capacity loss $dKap_{mean}$ is subsequently determined as a mean value over the averaged individual capacity losses.

If no sufficient static, that is substantially constant, capacity loss is yet achieved, the measurement of the load cycle is repeated. From the sorting, a particular number is again ascertained, for example rounded down 3% of the total length of the dataset and/or a minimum number of two, is selected and the corresponding start index of the fitted straight lines is ascertained. For each of the portions thus ascertained, the mean capacity loss $dKap_{mean}$ is given as an arithmetic mean value over the included capacity losses. The value of the mean capacity loss $dKap_{mean}$, however, can also be ascertained via the arithmetically averaged capacity losses.

FIG. 5 also makes clear that an ascertaining phase P2 adjoins the settling phase P1. These phases can be displaced during the evaluation of the capacity losses dKap.

Apart from the capacity loss, the coulomb efficiency is also used as a residual value criterion. This is calculated as follows $$CE=Q3/Q2 \qquad \text{Equation 4}$$

For the current calibration carried out in the third step, use can be made thereof that a discharging capacity Q0, which can be attributed to a discharged state, that is for example the second state of charge, can be calculated in two different ways, wherein the current calibration of the high-precision coulometry apparatus 4 is included differently in the two calculations. Thus, Q0 is in accordance with a first rule $$Q_0 = \frac{d2}{1-CE} \qquad \text{Equation 5}$$

Furthermore, Q0 can be calculated from the initial discharging capacity Q0A, which is assigned to a prior load cycle 100 and the capacity losses between the preceding load cycle 100 and the current load cycle:

$$Q_{0m}=Q_{0A}+\Sigma dKap \qquad \text{Equation 7}$$

In the case of an ideal, that is error-free, current measurement, the two values are identical, i.e.

$$Q_0=Q_{0m} \qquad \text{Equation 8}$$

However, in reality due to the current calibration present in the current measurement not being completely exact, the two values diverge from one another. The greater the difference in the values, the more error-laden the current calibration is.

Equation 8 is used in the form $f=Q_0-Q_{0m}$ as the basis for an optimization in which the function value f is to be minimized. The variables to be varied for the optimization form the current calibration. The current calibration is a mapping of a measured current value onto a corrected measurement value. If, by way of the optimization, an extensive matching between the values is achieved, then the corrected measurement values very accurately represent the real current flow. The optimization is undertaken in the computing unit 10 by the computer program 13.

LIST OF REFERENCE CHARACTERS

1 Apparatus
2 Battery
3 Temperature-controlled chamber
4 High-precision coulometry apparatus
10 Computing unit
11 Power cable
12 Data cable
13 Computer program product
21 First state of charge
22 Second state of charge
23 Third state of charge
24 Fourth state of charge
25 Upper voltage
26 Lower voltage
100 Load cycle
$t_C$ Charging period
$t_D$ Discharging period
201 . . . 207 First step . . . seventh step

The invention claimed is:

1. A method for ascertaining the residual value of a used battery, the method comprising:
   feeding the used battery to a temperature controlled chamber of a test station;
   heating the temperature controlled chamber thereby bringing the used battery to a test temperature;
   stabilizing the test temperature for a duration of a test such that deviations from the test temperature are less than 2 K;
   measuring a plurality of load cycles of the used battery using a coulometry apparatus, wherein the result of the measurement comprises a plurality of current values;
   carrying out load cycles until the result of the measurement fulfills a termination criterion;
   ascertaining, on the basis of the result of the measurement, a first value and a second value for a discharging capacity of the used battery using a first calculation rule and a second calculation rule;
   wherein calibration of the measurement is handled differently in the first calculation rule and the second calculation rule;
   carrying out an optimization process in which calibration of the measurement includes identifying the largest matching of the ascertained first charging capacity and second discharging capacity;
   determining, on the basis of the result of the measurement, at least one residual value criterion of the battery;
   determining, on the basis of the residual value criterion, whether the used battery is to be employed for use in a static energy storage device;
   if so, grouping the used battery into a group of homogenous batteries defined by matching the at least one residual value criterion for each battery in the group and deploying the group as a connected set of homogenous batteries in the static energy storage device and operating the static energy storage device.

2. The method as claimed in claim 1, wherein stabilizing the test temperature includes keeping the deviations from the test temperature to less than 0.5 K.

3. The method as claimed in claim 1, wherein stabilizing the test temperature uses a cooling system of the battery.

4. The method as claimed in claim 1, further comprising using the capacity of the battery and/or data stored in the used battery management system of the used battery as additional residual value criteria.

5. The method as claimed in claim 1, further comprising determining the at least one residual value criterion, a coulomb efficiency, an energy efficiency, an effective cell internal resistance, and/or a capacity loss per cycle of the used battery.

6. The method as claimed in claim 1, further comprising storing the at least one residual value criterion in a database with an identifier for the used battery.

7. The method as claimed in claim 6, further comprising:
capturing real aging data of batteries in use in a static energy storage device; and
determining, while using the real aging data and the stored at least one residual value criterion, whether the used battery will be used for operation in a static energy storage device.

8. The method as claimed in claim 1, wherein the load cycles comprise a discharging of less than 40% and function with a C-coefficient between 0.5 and 1.5.

9. The method as claimed in claim 1, further comprising ascertaining, from the at least one residual value criterion, a category of static energy storage devices for which the used battery is best suited.

10. The method as claimed in claim 1, wherein:
each load cycle comprises a first discharging in which a first charge quantity is measured from a first charging state to a second charging state, a subsequent first charging in which a second charge quantity is measured from the second charging state to a third charging state, and a second discharging in which a third charge quantity is measured from the third charging state to a fourth charging state;
the charging and discharging of the load cycle takes place between a lower voltage and an upper voltage of the used battery.

11. The method as claimed in claim 10, further comprising:
determining a first charge displacement using a difference between the fourth charging state and the second charging state;
determining a second charge displacement using a difference between the third charging state and the first charging state;
ascertaining a capacity loss using the difference between the first charge displacement and the second charge displacement; and
ascertaining a mean capacity loss on the basis of at least two capacity losses of different load cycles.

12. The method as claimed in claim 11, wherein the termination criterion includes a relative change of the capacity loss in two or more successive load cycles.

13. The method as claimed in claim 1, wherein the termination criterion is a function of the classification arising according to the result of the measurement.

14. An apparatus comprising: a used battery
a test station with a temperature controlled chamber;
a coulometry apparatus; and
a computing unit with a storage device for receiving results of a measurement series on the used battery, wherein the computing unit is configured to:
feed the used battery to the temperature controlled chamber of the test station;
bring the used battery to a test temperature;
stabilize the test temperature for a duration of a test such that deviations from the test temperature are less than 2 K;
measure a plurality of load cycles of the used battery using the coulometry apparatus, wherein the measurement produces a plurality of current values;
carry out load cycles until the current values fulfill a termination criterion;
ascertain a first value and a second value for a discharging capacity of the used battery using a first calculation rule and a second calculation rule applied to the plurality of current values;
wherein calibration of the current measurement is handled differently in the first calculation rule and the second calculation rule;
carry out an optimization process in which calibration of the current measurement includes identifying the largest matching of the ascertained first charging capacity and second discharging capacity;
determine, on the basis of the measurement, at least one residual value criterion of the used battery; and
determine, on the basis of the at least one residual value criterion, whether the used battery is to be employed for use in a static energy storage device.

* * * * *